United States Patent [19]

Tamashima et al.

[11] Patent Number: 5,102,030

[45] Date of Patent: Apr. 7, 1992

[54] METHOD FOR MOUNTING ELECTRONIC PARTS ON PRINTED CIRCUIT BOARD

[75] Inventors: Jun Tamashima; Masatoshi Ide, both of Tokyo, Japan

[73] Assignee: TDK Corporation, Tokyo, Japan

[21] Appl. No.: 729,523

[22] Filed: Jul. 12, 1991

[30] Foreign Application Priority Data

Sep. 6, 1990 [JP] Japan .................. 2-234421

[51] Int. Cl.⁵ .................. B23K 31/02; H05K 3/00
[52] U.S. Cl. .................. 228/175; 228/180.2; 156/299
[58] Field of Search .................. 228/176, 175, 180.2; 29/832, 840; 156/299, 330, 329

[56] References Cited

U.S. PATENT DOCUMENTS

| | | |
|---|---|---|
| 3,717,543 | 2/1973 | Sinclair et al. .................. 156/330 |
| 3,723,223 | 3/1973 | Le Compte .................. 156/330 |
| 3,963,551 | 6/1976 | Marlinske .................. 156/299 |
| 4,398,660 | 8/1983 | Pampalone et al. .................. 228/175 |
| 4,695,508 | 9/1987 | Kageyama et al. .................. 156/330 |
| 4,761,881 | 8/1988 | Boro et al. .................. 29/840 |
| 4,829,663 | 5/1989 | Masujima et al. .................. 29/740 |
| 5,037,700 | 8/1991 | Davis .................. 156/330 |

FOREIGN PATENT DOCUMENTS 1-190779  7/1989  Japan .................. 156/330

OTHER PUBLICATIONS

"Use of Adhesives with Chemical Activators . . . " Research Disclosure #28814 Apr. 1988, Kenneth Mason Publications Ltd., England.

Primary Examiner—Richard K. Seidel
Assistant Examiner—Jeanne M. Elpel
Attorney, Agent, or Firm—Seidel, Gonda, Lavorgna & Monaco

[57] ABSTRACT

A method for mounting electronic parts on a printed circuit board by applying an adhesive to a printed board at predetermined positions is provided. A droplet of an acryl-modified resin emulsion adhesive in a predetermined volume is ejected from a nozzle to said board at each of said positions, the adhesive is dried to remove water therefrom to ensure mounting of said parts on said binder and a solder is applied to said adhesive areas. The advantage is that an exact amount of adhesive for retaining each part on the board is obtained by each single droplet and in addition the nozzle is non-contactive to the board.

7 Claims, 4 Drawing Sheets

METHOD FOR MOUNTING ELECTRONIC PARTS ON PRINTED CIRCUIT BOARD

BACKGROUND OF THE INVENTION

This invention relates to an improved method for mounting electronic parts on a printed circuit board.

In order to mount electronic parts of relativelY small size on a printed board, it is a well-known practice to tack the parts to the board at predetermined positions using a binder (adhesive), followed bY applying melted solder to the positions to ensure fixation and electric connection between the parts and the board. While a variety of methods are emploYed to carry out the process automatically, a typical method comprises tacking a pluralitY of electronic parts on to a horizontally placed board using an automatic mounting device, turning over the entire board to have the side where the parts are mounted facing down, and bringing the entire board into contact with melted solder. There may be another method which comprises applying a creamy, or pasty, solder to the board in a predetermined pattern using a screen printing technology, tacking the parts to the board, and heating it in an oven to effect soldering in a fluidized state of the solder.

These require that the binder used for tacking the electronic parts should have sufficient stickiness to prevent the parts from dropping out or shifting when the board is turned over and heated. Although various kinds of factors will be possible for this requirement, major factors should include stickiness of the binder, especially when heated, reproducibility and controlability of binder volume, and separability of the binder (lack of stringing when extruded from the dispenser). In addition, it is required that the binder must allow the orientation of the part to easily be corrected when it was inadequate.

Typically in the prior art, a thermosetting binder, such as an epoxy resin, are gently extruded from a nozzle of a dispensing device, e.g. that of a pneumatic type, and retained on the nozzle tip. The binder is then transferred to the printed board at predetermined positions by pressing the tip on the board, where the electronic parts are tacked, and the binder is hardened [Japanese Patent Unscreened Publication (Toku-Kai-Shoh) Nos. 55-110,097 and 61-268,375]. Alternatively, an applicator pin is provided to allow a thermosetting binder from the container to adhere to the tip of the pin, where the binder is transferred to the board for tacking the parts, and then hardened [Japanese Utility Model (Jitsu-Kai-Shoh) No. 57-12,783].

Still another method comprises applying a light-hardening binder, such as an epoxy acrylate or urethane acrylate, to the printed board at predetermined positions, placing the parts on the binder for tacking them, and then hardening the binder by irradiating light, e.g. UV, on it (or placing the parts is preceded by partially hardening the binder through irradiation)[Japanese Patent Screened Publication (Toku-Koh-Shoh) Nos. 63-61,795, and 58-11,114, and Japanese Patent Unscreened Publication (Toku-Kai-Shoh) Nos. 54-104,573, and 54-98,969].

The major problem from which thermosetting binders are suffering is that, because of the momentary fluctuation of their viscosity, the extruding pressure in the dispenser must be adjusted frequently to ensure constant volume of dispensed binder. In addition, once the binder is hardened in the state of tacking the parts on the board, it is impossible to correct the orientation of the parts. Furthermore, in case that a thermosetting binder of increased viscosity is used for the purpose of an elevated securing force for the parts upon mounting on the board, such a binder brings about a problem of stringing during apportionment by the dispenser.

Investigations have been made for methods for the apportionment which will enable to avoid the above mentioned disadvantages involved with the contact-type dispensing device, in which binders are held on the nozzle tip, and then transferred to the board. Among several of designs, a method of non-contact type has been proposed as a conversion from the ink-jet method conventionally employed for printers [Japanese Patent Unscreened Publication (Toku-Kai-Sho) No. 63-228,699]. In this method, binders are sprayed in fine particles caused by the vibration of a piezoelectric device. Because of the droplets' extremely small volume available (approx. $10^{-8}$ cc), a substantially long time is required to attach the necessary volume of binders (approx. $10^{-4}$ cc) the printed board, making this method considered to be unfeasible.

Thus, it is an objective of the present invention to provide an efficient method for mounting electronic parts on a printed board, wherein a constant and controllable volume of binder droplets are ensured, the electronic parts are secured with a sufficient adhesiveness, and an orientational control of the parts is available at any time needed.

SUMMARY OF THE INVENTION

According to the present invention, the above-mentioned problems are solved by providing a method for mounting electronic parts on a printed board, wherein a binder (adhesive) is applied to a printed board at predetermined positions where said parts are to be mounted, to tack said parts to said board at said positions to which said binder has been applied, followed by applying a solder to areas between the external terminals of said parts and particular conductors on said printed board, characterized in that said method comprises ejecting a droplet of an acryl-modified resin emulsion binder in a predetermined volume from a nozzle to said board at said positions, drying said binder to remove water therefrom to ensure sufficient adhesiveness for securing said parts, mounting said parts on said binder, and applying said solder to said areas.

Preferably, said binder is pressurized to be introduced from a supplier tank thereof via a guiding tube into a valve chest, which intercommunicates with both the outlet of said guiding tube and the inlet of an ejector nozzle, where said binder is ejected in accordance with the opening of a movable valve body for a controlled time interval, which valve body, being placed within said valve chest, confronts with the inlet end of said nozzle, and is usually closed.

The relatively low viscosity of acryl-modified resin emulsion binders enables to dispense the binders in an exactly predetermined volume to the printed board at predetermined positions, using the ejector nozzle. In addition, an increased stickiness of the binders caused by removing water after the dispensation does not only ensure sufficient securing force for the electronic parts adhering to the board when turned over, but also enable to correct the orientation of the tacked parts, if necessary. Furthermore, the binders enable to provide a "self-regulation" by the parts to keep correct orientation through utilizing the surface tension of solders. Because of the aqueous nature of acryl-modified resin emulsion binders unlike the conventional epoxy resin binders or light-hardening binders, no stringing occurs, resulting in enabling to avoid pollution both in the nozzle and printed board.

The acryl-modified resins emulsion binders that can be used in the present invention include thermoplastic acryl-modified resins, such as acrylic silicone emulsion binders, and thermosetting acryl-modified resins, such as acrylic epoxy resin emulsion binders.

In the following, the method according to the present invention is being described in detail referring to accompanying drawings for the purpose of illustration only and not for limiting the invention.

DETAILED DESCRIPTION OF THE INVENTION

Referring to FIGS. 1 through 4, the method according to the present invention is being illustrated, wherein a binder is dispensed on a printed board in a manner of non-contact type, and electronic parts are then mounted on the board.

Figure 1:
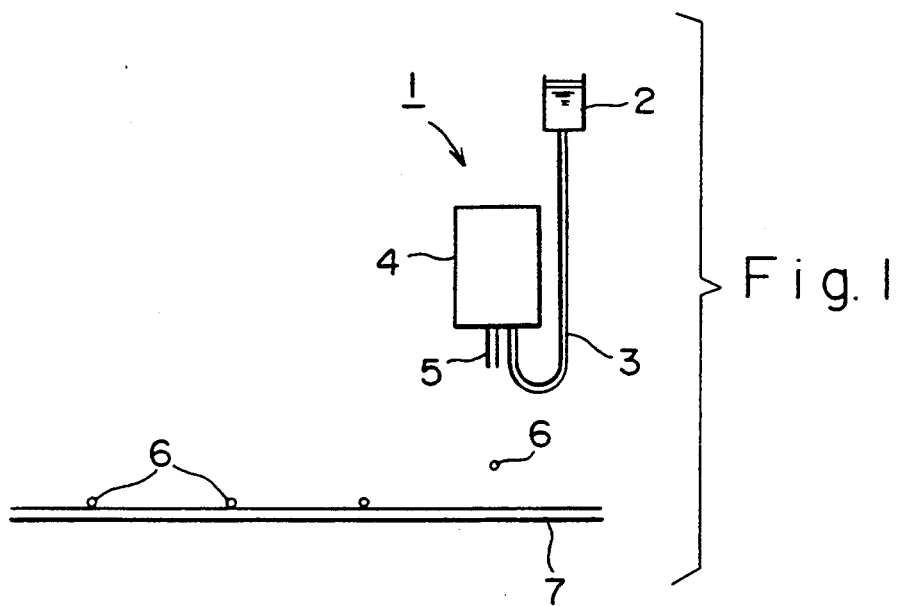
FIG. 1 illustrates a process of dispensing a binder in the method for mounting electronic parts on a printed board according to the present invention.

First, as shown in FIG. 1, droplets of a binder 6 of predetermined volume are dispensed on the surface of a printed board 7 at predetermined positions one by one, using a binder dispensing device (dispenser) 1, details of which will be hereinafter described. The dispenser 1 consists of a binder supplier tank 2 pressurized to a certain pressure, a guiding tube 3 extended therefrom, a magnetic valve 4 connected with the guiding tube, and ejector nozzle 5 for releasing the binder. The magnetic valve 4 is of an opening-closing type, with its time interval of opening and closing being adjustable (detailed description to follow), thereby allowing supplied said pressurized binder to be released from said ejector nozzle 5, in the form of droplets 6 whose volume is proportional to the particular interval of opening, and to fly to said printed board 7 at the predetermined positions. The volume of said droplets depends to the viscosity and pressure of said binder 6, and flow resistance in said ejector nozzle 5 (resistance is inverse proportional to the sectional area of ejector nozzle, and is proportional to the length thereof). The volume of binder droplets 6 amounts to the order of $10^{-4}$cc, well ensuring the volume required for one droplet to secure one electronic part.

Figure 2:
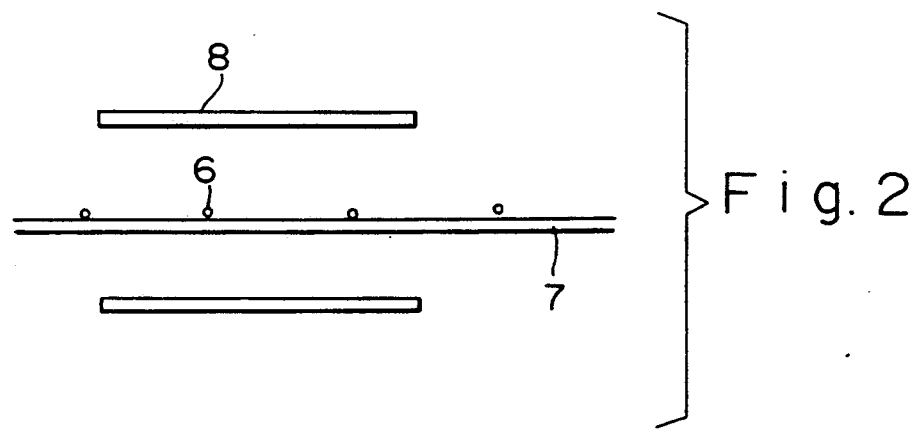
FIG. 2 illustrates a process of drying the printed board according to the present invention.

Referring to FIG. 2, said printed board 7 is then passed through a microwave dryer 8 (e.g. a microwave oven) to dry the binder droplets 6 and remove water contained therein. This dehydration brings about as much stickiness in the binder as required to secure the electronic part.

Figure 3:
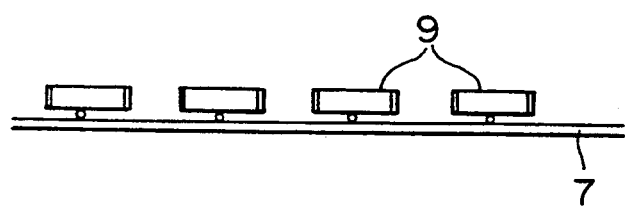
FIG. 3 illustrates a process of mounting electronic parts according to the present invention.

Reference is now made to the process shown in FIG. 3, wherein mounting, or tacking the electronic parts 9 is completed through making an arrangement of and mounting particular parts at predetermined positions, followed by pressing them onto respective binder droplets 6, which had been deprived of water and dried.

Figure 4:
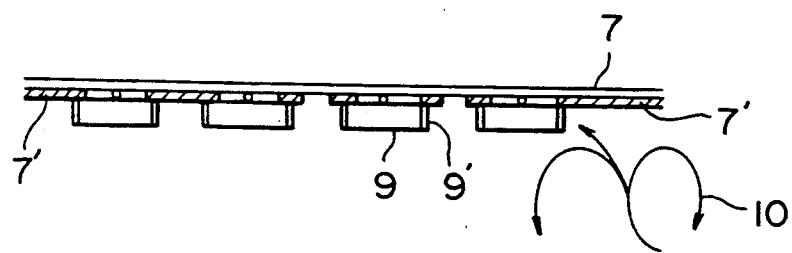
FIG. 4 illustrates a process of applying solder to the electronic parts according to the present invention.

During the process shown in FIG. 4, the printed board 7 is turned over upside down, and the side where the electronic parts 9 had been mounted is brought into contact with melted solder 10 to effect the required connection and fixation between the external terminals 9' of the parts 9 and the printed circuit 7' on the board 7.

By using an acrylic silcone emulsion binder, i.e. a sort of thermoplastic binder, to carry out the above method for mounting, one can solve many of the problems caused by the conventional methods. Acrylic silicone emulsion binder does not string when ejected from nozzles, having sufficient fluidity to readily form droplets when pressurized. By evaporating water contained in its droplets, it develops satisfactory stickiness under the thermal effect upon soldering, still it retains sufficient softness to change the orientation of the parts.

In the following, details of a binder dispenser 1 to be used in the binder dispensing process of FIG. 1 will be described with reference to FIGS. 5 and 6.

Figure 5:
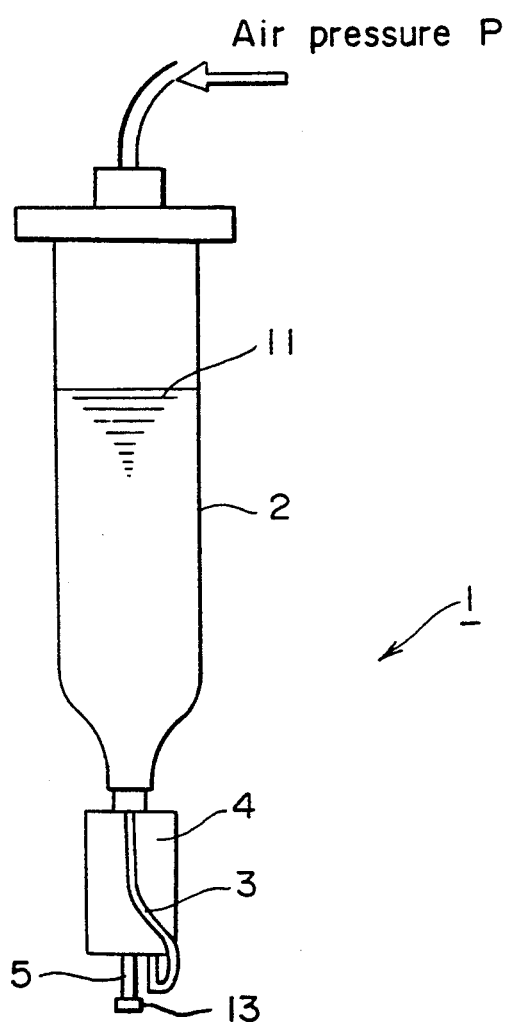
FIG. 5 is a general view of a binder dispensing device used for the method according to the present invention.

Referring to FIG. 5, the supplier tank 2 for binder 11 is kept under a predetermined constant pressure, so that the binder droplets might be ejected from the ejector nozzle 5 upon opening of the magnetic valve 4, and is preferably kept together with other portions in a constant temperature, in order to keep the viscosity of the binder passing the nozzle 5 constant. Pressurizing the supplier tank 2 is designed so that any fluctuation in the pressure caused by changes in the binder volume within the tank, the degree of fluctuation being negligible, might not affect the volume of dispensed binder.

Then, the binder 11 is directed to a magnetic valve 4 via the guiding tube 3. A certain volume of binder is released from the ejector nozzle 5, which volume is measured by means of controlling the interval of opening of the magnetic valve 4. Preferably, the tip of the nozzle 5 is kept wet with water to avoid its drying up when it is not in use. Also, a water-repellent coating, such as with fluororesin is preferably applied to the tip to expedite the release of binder.

Figure 6:
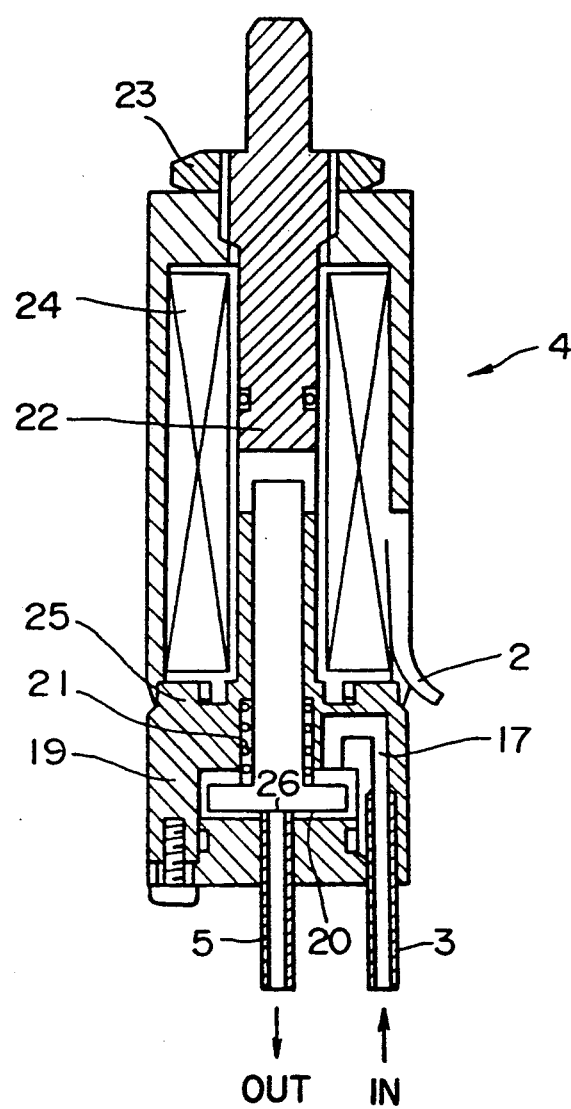
FIG. 6 is a longitudinal cross-sectional view detailing a magnetic valve used for the method accoding to the present invention.

Details of the magnetic valve 4 are shown in FIG. 6. The binder enters a valve chest 19 from a guiding tube 3 via an internal path 17 provided in housing 25. The upper end of ejector nozzle 5 comprises an outlet valve seat 26, which normally is closed by valve body 20, which is normally biased downward by force of a compression spring 21. When a magnetiç coil 24 draws the valve body 20, made of soft magnetic materials, up, the valve body 20 enables the binder to flow towards the ejector nozzle 5, and then release this pressurized binder from the ejector nozzle 5 in the form of a droplet. Above the valve body 20, a magnetic core 22 is inserted in a similar manner, and fixed with a nut 23. Power supply to the magnetic coil 24 is effected through a lead 2. The feeding interval is optionally assigned in any predetermined value, using a regulator not drawn in the figures.

The present inventor(s) carried out a variety of experiments using a device composed as above. Consequently, the aforementioned various effects are confirmed to be obtainable; by changing the interval of opening for the magnetic valve, the volume of binder required to mount the particular electronic part can be controlled in a substantially wide range, and a uniformity in the apportioned volume can always be ensured when a sufficiently large value is assigned for the volume of supplier tank, etc. Also, it has been observed that, within a certain range of opening interval, binders attach to the printed board, not in the form of continuous strings, but in nearly spherical droplet, which is formed by the force of its surface tension in the course of its flight towards the printed board.

EXPERIMENTS

The acrylic silicone emulsion binder used in the experiments was based on a molecular structure mainly comprising a copolymer of methyl acrylate, butyl acrylate, and styrene. Water was used to form the emulsion. Non-volatile components accounted for about 45% by weight, and viscosity was about 20cp. By using the above-mentioned dispensing device, dispensation of droplet on the printed board could be achieved in the formation of droplets in predetermined volume. In this connection: the droplets travelled in the air in the form of clearly shaped spheres, and attached onto the board with their shape changing into hemispheres. There observed no stringing, whereby the possibility of pollution on the board with the binder was eliminated. It was required about the order of two minutes to dry the binder in order to develop the predetermined stickiness as needed for securing the electronic parts, when a microwave oven was used. Dried binder obtained had a sufficient stickiness even at the temperature of 250° C., and showed an enough performance to secure the electronic parts under the soldering conditions. On the other hand, it had as much thermoplasticity as it enabled to change the orientation of the electronic parts in a state of adhering to the board.

The ejector nozzle used in the experiments was consisted of a cylindrical tube with inside diameter of 0.21 mm and length of 5.5 mm equipped on its distal end with a fluororesin piece with inside diameter of 0.2 mm, outside diameter of 0.8 mm, and length of 0.8 mm. The pressure applied to the binder supplier tank was 0.5 kg/cm$^2$.

EFFECTS OF THE INVENTION

The effects of the invention are summarized as follows:

(1) According to the present invention, the employment of low viscosity thermoplastic acrylic silicone emulsion binder enables to dispense droplets in an exactly predetermined volume from an ejector nozzle to a printed board at predetermined positions. In addition, it is not required to contact the nozzle tip with the printed board, and this fact enables to move the nozzle to predetermined positions on the printed board without moving the nozzle up and down, and to achieve rapid and quiet motion of the nozzle;

(2) The binder used in the present method develops sufficient stickiness to secure electronic parts at such a high temperature as employed for soldering, through removing water contained in the binder;

(3) Because of its thermoplasticity, the binder allows to correct the orientation of the tacked parts, if necessary, or it enables to provide a "self-regulation" by the parts to keep correct orientation through utilizing the surface tension of solders;

(4) Because of its aqueous nature, unlike the conventional epoxy resin binders or light-hardening binders, this binder brings about no stringing, resulting in enabling to avoid pollution both in the nozzle and printed board;

(5) In general, this method is extremely efficient, enabling to substantially reduce the working time.

What is claimed is:

1. In a method for mounting electronic parts on a printed circuit board, by applying an adhesive to a printed circuit board at predetermined positions where said parts are to be mounted, mounting said parts on said board at said positions to which said binder has been applied, and applying a solder to areas between external terminals of said parts and particular conductors on said printed circuit board, the improvement comprising:

ejecting a droplet of an acryl-modified resin emulsion binder in a predetermined volume from a nozzle to said board at each of said positions, drying said binder to remove water therefrom to ensure sufficient adhesiveness for securing said parts, mounting said parts on said binder, and applying said solder to said areas.

2. A method according to claim 1, wherein said adhesive is introduced from a pressurized supplier tank, led via a guiding tube into a valve chest, which intercommunicates with said guiding tube and with an inlet of an ejector nozzle, and then ejected through said nozzle in response to the opening of a movable valve body for a controlled time interval, said valve body being placed within said valve chest, detachably seated against the inlet of said nozzle and being normally closed.

3. A method according to claim 1, wherein drying said binder is carried out by means of microwave.

4. A method according to claim 1, wherein said acryl-modified resin emulsion is a thermosetting acryl-modified resin emulsion.

5. A method according to claim 4 wherein said thermosetting acryl-modified resin is an acrylic expoxy resin emulsion.

6. A method according to claim 1, wherein said acryl-modified resin emulsion is a thermoplastic acryl-modified resin emulsion.

7. A method according to claim 6 wherein said thermoplastic acryl-modified resin is an acrylic silicone resin emulsion.

* * * * *